(12) United States Patent
Ohtsuka

(10) Patent No.: US 7,906,820 B2
(45) Date of Patent: Mar. 15, 2011

(54) SOURCE OFFSET MOSFET OPTIMIZED FOR CURRENT VOLTAGE CHARACTERISTIC INVARIANCE WITH RESPECT TO CHANGING TEMPERATURES

(75) Inventor: Masaya Ohtsuka, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 37 days.

(21) Appl. No.: 12/263,127

(22) Filed: Oct. 31, 2008

(65) Prior Publication Data
US 2009/0121294 A1    May 14, 2009

(30) Foreign Application Priority Data
Nov. 13, 2007   (JP) .................................. 2007-294828

(51) Int. Cl.
*H01L 29/06*   (2006.01)
(52) U.S. Cl. ................. 257/408; 257/208; 257/E29.278
(58) Field of Classification Search ........... 257/E29.278, 257/288, 408
See application file for complete search history.

(56) References Cited

U.S. PATENT DOCUMENTS

| | | | | |
|---|---|---|---|---|
| 5,198,379 A | * | 3/1993 | Adan | ............................. 438/151 |
| 5,256,584 A | * | 10/1993 | Hartmann | ..................... 438/257 |

FOREIGN PATENT DOCUMENTS

| | | |
|---|---|---|
| JP | 2001-185724 | 7/2001 |
| JP | 2002-261273 | 9/2002 |
| JP | 3513411 | 1/2004 |
| JP | 2006-216607 | 8/2006 |
| JP | 2008-21962 | 1/2008 |

* cited by examiner

*Primary Examiner* — A. Sefer
*Assistant Examiner* — Allen L Parker
(74) *Attorney, Agent, or Firm* — Cooper & Dunham LLP

(57) ABSTRACT

A semiconductor device is disclosed. The semiconductor device includes a source offset type MOS transistor in which a source and a drain are formed on a semiconductor substrate by having a predetermined distance between the source and the drain, and a gate electrode is formed on the semiconductor substrate between the source and the drain via a gate insulation film. One end of the drain overlaps or abuts on one end of the gate electrode when viewed from above the gate electrode, and the source is formed by having a distance from the gate electrode when viewed from above the gate electrode.

7 Claims, 9 Drawing Sheets

SOURCE OFFSET MOSFET OPTIMIZED FOR CURRENT VOLTAGE CHARACTERISTIC INVARIANCE WITH RESPECT TO CHANGING TEMPERATURES

BACKGROUND

1. Technical Field

This disclosure generally relates to a semiconductor device having a MOS (metal oxide semiconductor) transistor which provides a source and a drain formed on a semiconductor substrate by having a predetermined distance between the source and the drain and a gate electrode formed between the source and the drain on the semiconductor substrate via a gate insulation film.

2. Description of the Related Art

Recently, in a semiconductor device, in order to increase the speed of digital operations, a gate electrode of the semiconductor device has been formed by a micro-fabrication technology. In addition, a semiconductor device has been used as an analog device such as a power source device. In particular, when the semiconductor device is used as the analog device, temperature dependency and voltage dependency of the semiconductor device influence circuit characteristics of the analog device, and a technology to compensate the influences by the temperature dependency and the voltage dependency has been important.

A MOS transistor in a semiconductor device provides a source and a drain formed on a semiconductor substrate by having a predetermined distance between the source and the drain and a gate electrode formed between the source and the drain on the semiconductor substrate via a gate insulation film. Ends of the source and the drain overlap or abut on a gate electrode when viewed from above the gate electrode (for example, refer to Patent Documents 1 and 2). Or the source and the drain are disposed to have a predetermined distance from the gate electrode when viewed from above the gate electrode (for example, refer to Patent Document 3).

For example, a driver transistor has been installed in a semiconductor device. The driver transistor has a relatively large channel width for driving a next stage element. As an example using the driver transistor, a charging circuit (device) for a mobile telephone is described.

FIG. 7 is a circuit diagram showing a charging device. In FIG. 7, (a) shows a status before charging a battery and a transistor 37 is turned OFF, and (b) shows a status where the battery is being charged. As shown in FIG. 7, a rechargeable battery 31 is connected to a power source 35 (corresponding to a household wall AC outlet) via a charging switch 33. When the transistor 37 is turned ON, the charging switch 33 connected to the transistor 37 via an electrode pad 23 is turned ON, and as shown in FIG. 7(b), a current A flows into the rechargeable battery 31 from the power source 35.

In FIG. 7, the transistor 37 is the driver transistor. That is, the transistor 37 drives the charging switch 33 which is a next stage element. In addition, when the amount of the current A is large, the period to charge the rechargeable battery 31 is short; therefore, a current B flowing into the transistor 37 is required to be large. The current flowing into the transistor 37 is proportional to the channel width of the transistor 37; therefore, the channel width of the transistor 37 is designed to be large.

Next, the driver transistor is described in detail.

FIG. 8 is a cut-away side view of a conventional driver transistor.

As shown in FIG. 8, a LOCOS (local oxidation of silicon) oxide film 43 for determining a driver transistor forming region is formed on a silicon substrate 41. Sources 45 and drains 47 formed of an N type impurity diffusion layer are formed on the silicon substrate 41 at the driver transistor forming region surrounded by the LOCOS oxide film 43. The sources 45 and the drains 47 are alternately formed by having a distance between the sources 45 and the drains 47.

A gate electrode 51 formed of polysilicon is formed on the silicon substrate 41 between the source 45 and the drain 47 via a gate oxide film 49. That is, the plural gate electrodes 51 are formed between the corresponding sources 45 and drains 47. When the driver transistor is viewed from above, an end of the source 45 and an end of the drain 47 overlap corresponding ends of the gate electrode 51. In FIG. 8, the four gate electrodes 51 are shown. However, in order to make the channel width large, generally, some tens of the gate electrodes 51 are formed in the driver transistor.

A first dielectric interlayer (not shown) is formed on the entire surface of the silicon substrate 41 including regions where the sources 45, the drains 47, and the gate electrodes 51 exist. A metal wiring layer (not shown), a second dielectric interlayer (not shown), a protection film (not shown), and so on are formed on the first dielectric interlayer. The plural sources 45 are electrically connected with each other via contact holes (not shown) and the metal wiring layer. In addition, the plural drains 47 are electrically connected with each other via contact holes (not shown) and the metal wiring layer.

As shown in FIG. 8, in the driver transistor, the sources 45 and the drains 47 are alternately disposed at both sides of the corresponding gate electrodes 51. When the driver transistor is turned ON, currents flow in arrow directions shown in FIG. 8. That is, one source 45 operates for two gate electrodes 51 and one drain 47 operates for two gate electrodes 51. Therefore, a large current can flow within a small area.

[Patent Document 1] Japanese Laid-Open Patent Application No. 2002-261273

[Patent Document 2] Japanese Laid-Open Patent Application No. 2001-185724

[Patent Document 3] Japanese Patent No. 3513411

However, in the conventional driver transistor (MOS transistor) in which the end of the source and the end of the drain overlap the corresponding ends of the gate electrode when viewed from above the gate electrode, when temperature rises, the amount of the drain current is lowered. In particular, in an analog circuit, temperature dependency and voltage dependency of the semiconductor device influence characteristics of the analog circuit; therefore, it is preferable that temperature characteristics in a drain voltage and a drain current of the MOS transistor be adjusted.

BRIEF SUMMARY

In an aspect of this disclosure, there is provided a semiconductor device having a MOS transistor in which temperature characteristics in a drain voltage and a drain current can be adjusted.

In another aspect of this disclosure, there is provided a semiconductor device that includes a source offset type MOS transistor in which a source and a drain are formed on a semiconductor substrate by having a predetermined distance between the source and the drain, and a gate electrode is formed on the semiconductor substrate between the source and the drain via a gate insulation film. One end of the drain overlaps or abuts on one end of the gate electrode when viewed from above the gate electrode, and the source is formed by having a distance from the gate electrode when viewed from above the gate electrode.

In another aspect, a semiconductor device includes a source offset type MOS transistor in which a source and a drain are formed on a semiconductor substrate by having a predetermined distance between the source and the drain, and a gate electrode is formed on the semiconductor substrate between the source and the drain via a gate insulation film. One end of the drain overlaps or abuts on one end of the gate electrode when viewed from above the gate electrode, and the source is formed by having a distance from the gate electrode when viewed from above the gate electrode.

As discussed herein, when the distance between the source and the gate electrode is adjusted, the temperature characteristics in a drain voltage and a drain current can be adjusted. In addition, an element or a circuit for compensating an influence caused by temperature dependency is not required. Further, when the source offset type MOS transistor is used as a driver transistor, an output from the driver transistor can be stable even if the temperature is changed.

BRIEF DESCRIPTION OF THE DRAWINGS

The aforementioned and other aspects, features and advantages will become more apparent from the following detailed description when read in conjunction with the accompanying drawings, in which.

DESCRIPTION OF THE PREFERRED EMBODIMENTS

[Best Mode of Carrying Out the Invention]
The best mode of carrying out the present invention is described with reference to the accompanying drawings.

First Embodiment

Figure 1:
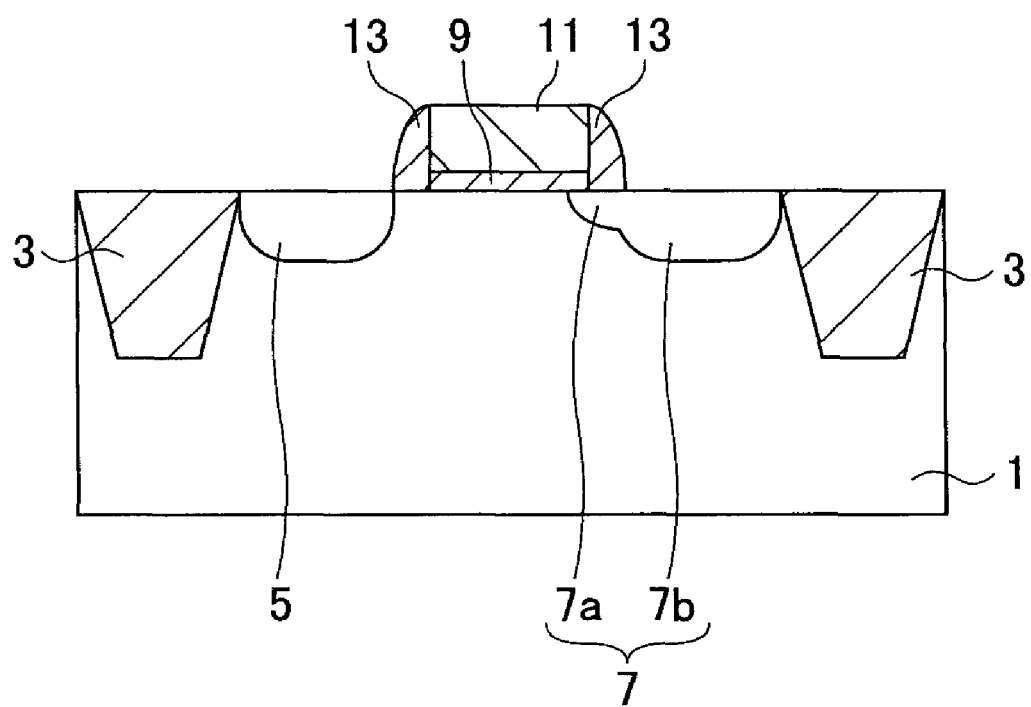
FIG. 1 is a cut-away side view of a source offset type MOS transistor according to a first embodiment of the present invention.

FIG. 1 is a cut-away side view of a source offset type MOS transistor according to a first embodiment of the present invention.

As shown in FIG. 1, an STI (shallow trench isolation) 3 for determining a transistor forming region is formed on, for example, a P type silicon substrate (semiconductor substrate) 1.

In addition, a P type well (not shown) is formed in the transistor forming region of the P type silicon substrate 1.

A source 5 and a drain 7 formed of an N type impurity diffusion layer are formed in the transistor forming region of the P type silicon substrate 1 by having a predetermined distance between the source 5 and the drain 7. In the first embodiment of the present invention, the source 5 is formed of one N type impurity diffusion layer and the drain 7 has a LDD (light doped drain) structure formed of a low concentration diffusion layer 7a and a high concentration diffusion layer 7b.

A gate electrode 11 is formed on the P type silicon substrate 1 at a position between the source 5 and the drain 7 via a gate insulation film 9. The gate insulation film 9 is formed of, for example, a silicon oxide film, and the gate electrode 11 is formed of, for example, polysilicon. One end of the gate electrode 11 overlaps one end of the low concentration diffusion layer 7a of the drain 7 when viewed from above the gate electrode 11. In addition, a distance exists between the source 5 and the gate electrode 11 when viewed from above the gate electrode 11. With this, the source offset type MOS transistor is formed. In addition, a side wall 13 is formed of, for example, an HTO (high temperature oxide) film on the side surface of the gate electrode 11.

In addition, a first dielectric interlayer (not shown) is formed on the entire surface of the P type silicon substrate 1 including regions where the source 5, the drain 7, and the gate electrode 11 exist. A metal wiring layer (not shown), a second dielectric interlayer (not shown), a protection film (not shown), and so on are formed on the first dielectric interlayer.

Figure 2:
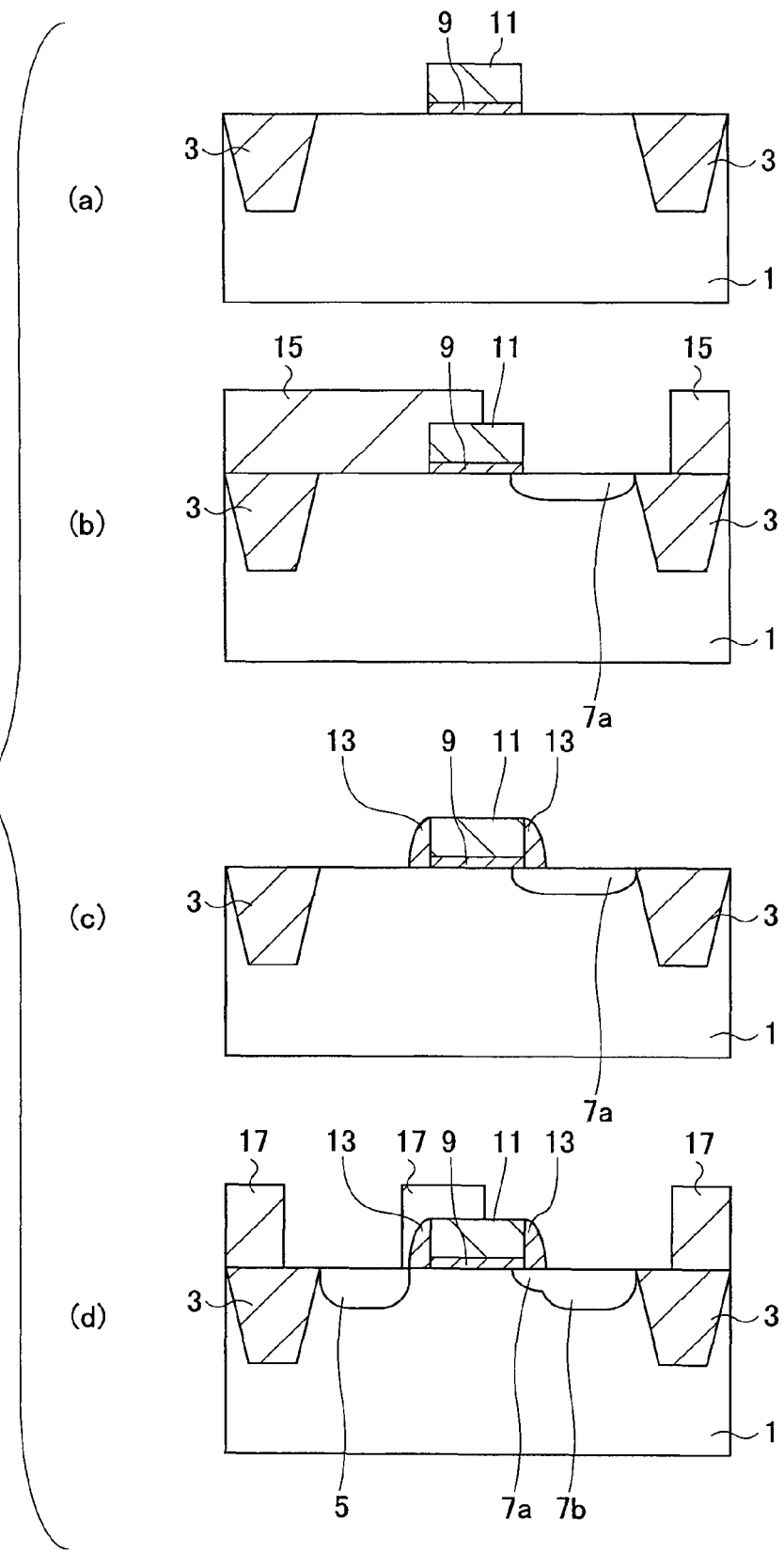
FIG. 2 is cut-away side views showing corresponding manufacturing processes of the source offset type MOS transistor shown in FIG. 1.

Next, manufacturing processes of the source offset type MOS transistor shown in FIG. 1 are described. FIG. 2 is cut-away side views showing the corresponding manufacturing processes of the source offset type MOS transistor shown in FIG. 1. In FIG. 2, (a) shows a first process, (b) shows a second process, (c) shows a third process, and (d) shows a fourth process.

Referring to FIGS. 1 and 2, the manufacturing processes of the source offset type MOS transistor shown in FIG. 1 are described.

In the first process shown in FIG. 2(a), a P type well (not shown) and an STI 3 are formed in a P type silicon substrate 1. In addition, a silicon oxide film whose thickness is, for example, 10 nm is formed on the P type silicon substrate 1. Further, a poly silicon film whose thickness is, for example, 300 nm is formed on the silicon oxide film. By using a lithography process and an etching process, patterning is applied to the polysilicon film and the silicon oxide film. With this, a gate electrode 11 and the gate insulation film 9 are formed.

Next, in the second process shown in FIG. 2(b), by using a lithography process, a resist pattern 15 is formed which pattern covers a region where a source is to be formed and has an opening section at a region where a drain is to be formed. Then, a low concentration diffusion layer 7a formed of an N type diffusion layer is formed by implanting, for example, phosphorus ions with the use of the resist pattern 15 and the gate electrode 11 as masks. In the ion implantation, the ion implantation energy is, for example, 30 KeV, and the dosage is, for example, $5 \times 10^{13}/cm^2$.

Next, in the third process shown in FIG. 2(c), the resist pattern 15 is removed. An HTO film is formed on the P type silicon substrate 1, and a side wall 13 is formed at the side surface of the gate electrode 11 by applying an anisotropic etching back process to the HTO film.

Next, in the fourth process shown in FIG. 2(d), by using a lithography process, a resist pattern 17 is formed which pattern has an opening section at a region where the source is to be formed and an opening section at a region where the drain is to be formed. In this way, in order to have a predetermined distance between the source and the gate electrode 11 when viewed from above the gate electrode 11, the resist pattern 17 is also formed on the P type silicon substrate 1 at the position near the side wall 13 of the source side. Then, for example, arsenic ions are implanted on the P type silicon substrate 1 by using the resist pattern 17, the gate electrode 11, and the side wall 13 as masks. In the ion implantation, the ion implantation energy is, for example, 50 KeV, and the dosage is, for example, $5 \times 10^{15}/cm^2$. With this, a source 5 is formed by having the distance from the gate electrode 11 when viewed from above the gate electrode 11 and a drain 7 having the low concentration diffusion layer 7a and a high concentration diffusion layer 7b is formed. When the resist pattern 17 is removed, as shown in FIG. 1, the source offset type MOS transistor is formed.

As described above, the source offset type MOS transistor can be formed by the manufacturing processes in which the number of the processes is the same as the number of the conventional processes.

Next, measured results of temperature characteristics in a drain voltage and a drain current of corresponding MOS transistors are described.

FIGS. 3A through 3F are graphs showing the measured results of the temperature characteristics in the drain voltage and the drain current of the corresponding MOS transistors.

Figure 3A:
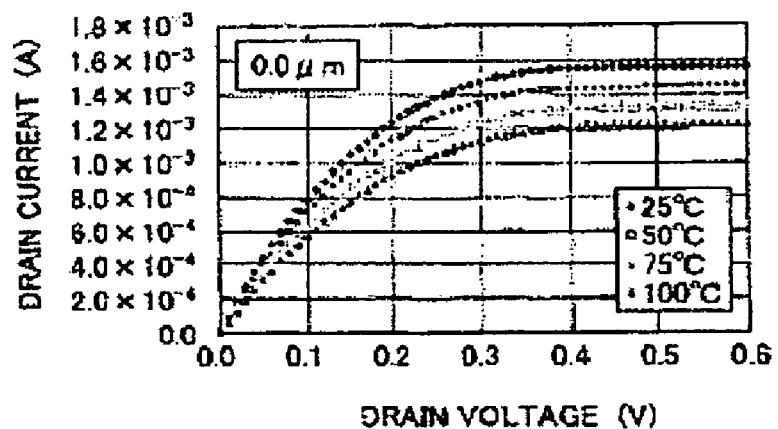
FIGS. 3A through 3F are graphs showing measured results of temperature characteristics in a drain voltage and a drain current of the corresponding MOS transistors.

In FIG. 3A, as an example, a conventional MOS transistor having an LDD structure was used in which the distance between the source and the gate electrode is 0.0 μm when viewed from above the gate electrode. In FIGS. 3B through 3F, the distances between the source 5 and the gate electrode 11 in the source offset type MOS transistor when viewed from above the gate electrode 11 are 0.1 μm, 0.2 μm, 0.3 μm, 0.4 μm, and 0.5 μm, respectively. As shown in FIGS. 3A through 3F, the vertical axis shows the drain current and the horizontal axis shows the drain voltage. In addition, in FIGS. 3A through 3F, the source and the semiconductor substrate were grounded and the gate voltage was 6 V. Further, the gate width was 2.5 μm.

As shown in FIG. 3A, in the conventional MOS transistor in which the distance was 0.0 μm, since the mobility was lowered due to the lattice scattering in the high temperature, the drain current was lowered in the high temperature. In addition, the temperature characteristics were changed by approximately 30% between the temperature 25 and 100° C.

Figure 3B:
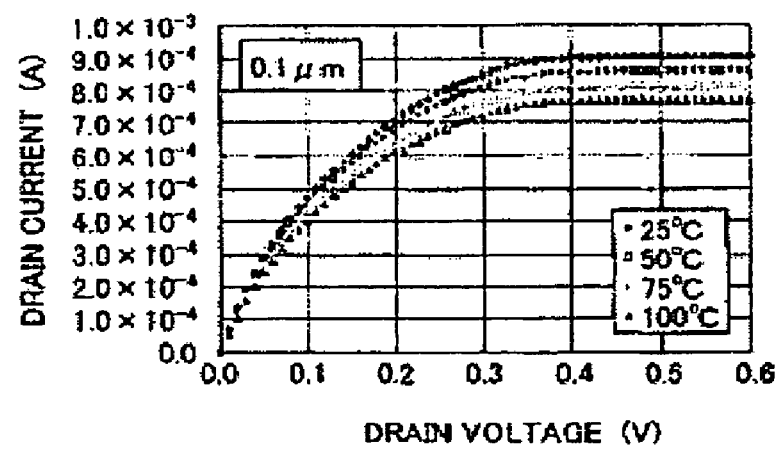

As shown in FIG. 3B, in the source offset type MOS transistor according to the present embodiment in which the distance was 0.1 μm, when the temperature rose, the drain current was also lowered; however, the temperature characteristics were not greatly changed between the temperature 25 and 100° C. when temperature characteristics were compared with those of the conventional MOS transistor.

Figure 3C:
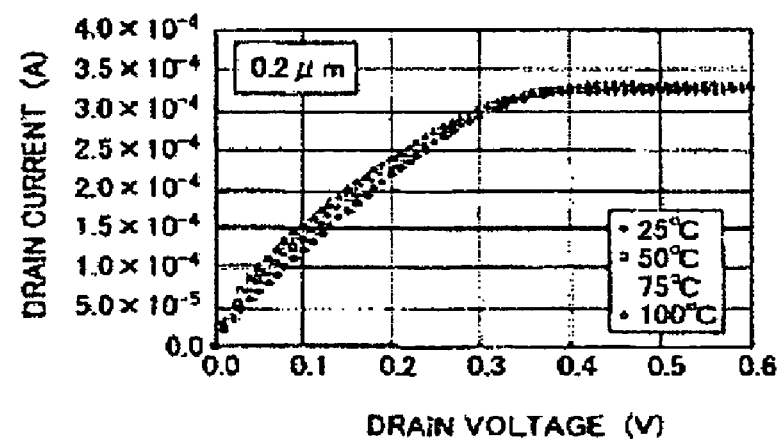

As shown in FIG. 3C, in the source offset type MOS transistor according to the present embodiment in which the distance was 0.2 μm, the temperature characteristics were approximately constant in the saturation region of the drain current. That is, when the distance between the source 5 and the gate electrode 11 when viewed from above the gate electrode 11 is adjusted, the temperature characteristics in the drain current and the drain voltage can be constant.

Figure 3D:
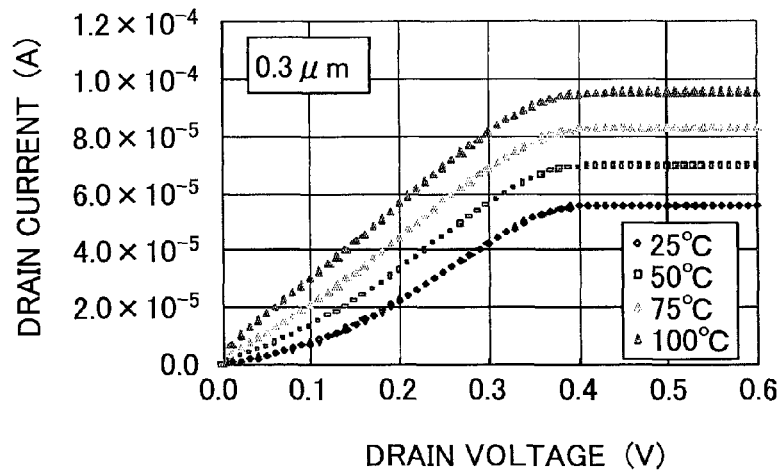
Figure 3E:
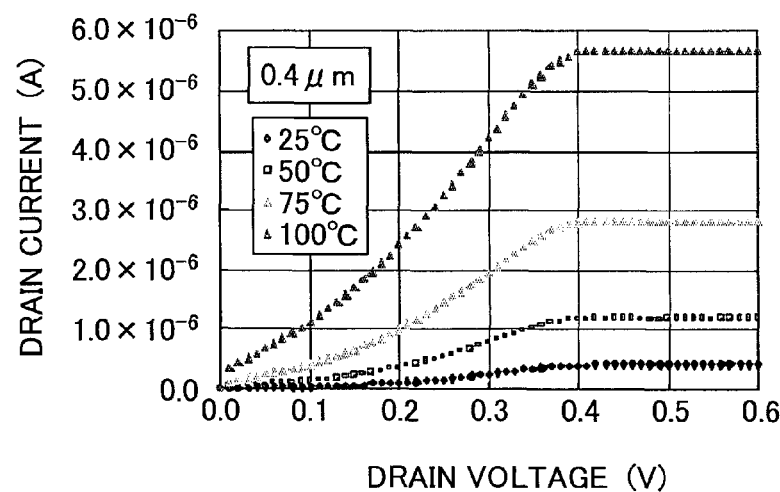
Figure 3F:
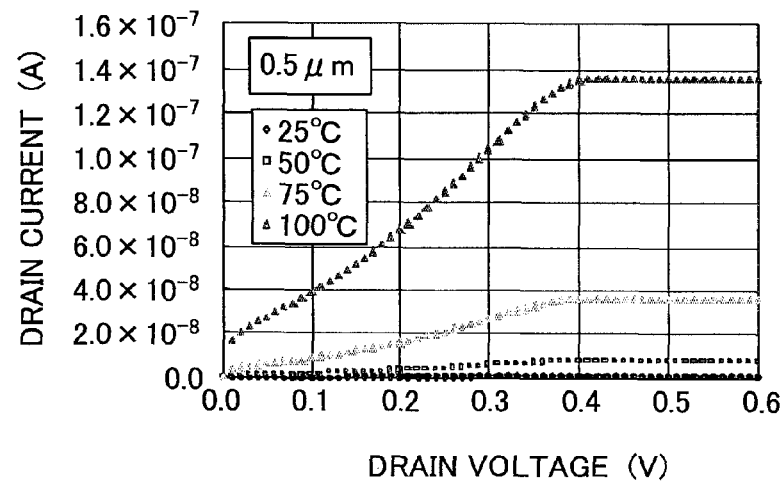

In addition, as shown in FIGS. 3D through 3F, in the source offset type MOS transistors according to the present embodiment in which the distances were 0.3 μm, 0.4 μm, and 0.5 μm, respectively, in a case where the source offset type MOS transistors were compared with the conventional MOS transistor shown in FIG. 3A, when the temperature rises, the drain current also rises.

As described above, when the distance between the source 5 and the gate electrode 11 when viewed from above the gate electrode 11 is adjusted, the temperature characteristics in the drain current and the drain voltage can be changed.

In the source offset type MOS transistor according to the present embodiment, in order to obtain desirable temperature characteristics in the drain current and the drain voltage, the distance between the source 5 and the gate electrode 11 when viewed from above the gate electrode 11 and the manufacturing processes must be adjusted. The distance between the source 5 and the gate electrode 11 when viewed from above the gate electrode 11 is preferably 1 μm or less and is more preferably 0.5 μm or less.

Figure 4:
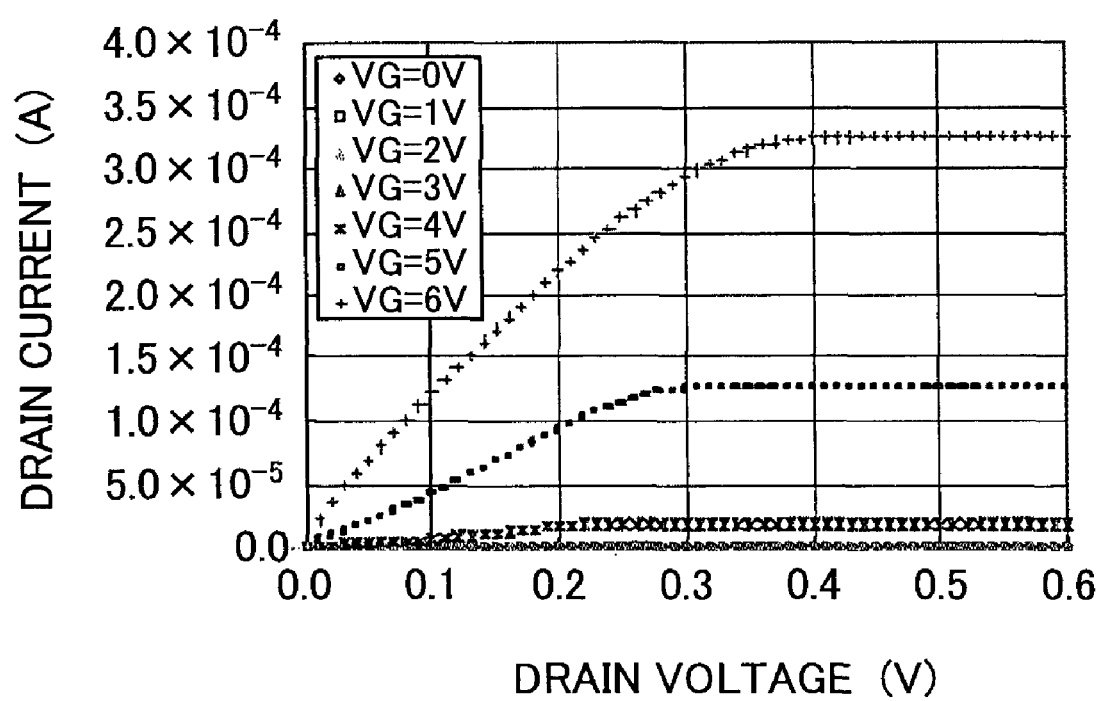
FIG. 4 is a graph showing measured results of characteristics in the drain voltage and the drain current of the source offset type MOS transistor shown in FIG. 1 in which a distance between a source and a gate electrode is 0.2 μm when a gate voltage is changed.

FIG. 4 is a graph showing measured results of the characteristics in the drain voltage and the drain current of the source offset type MOS transistor according to the present embodiment in which the distance between the source 5 and the gate electrode 11 is 0.2 μm when a gate voltage VG is changed. In FIG. 4, the vertical axis shows the drain current and the horizontal axis shows the drain voltage. In addition, the temperature was a room temperature.

As shown in FIG. 4, the source offset type MOS transistor according to the present embodiment can operate as a transistor similar to a conventional MOS transistor.

Second Embodiment

Figure 5:
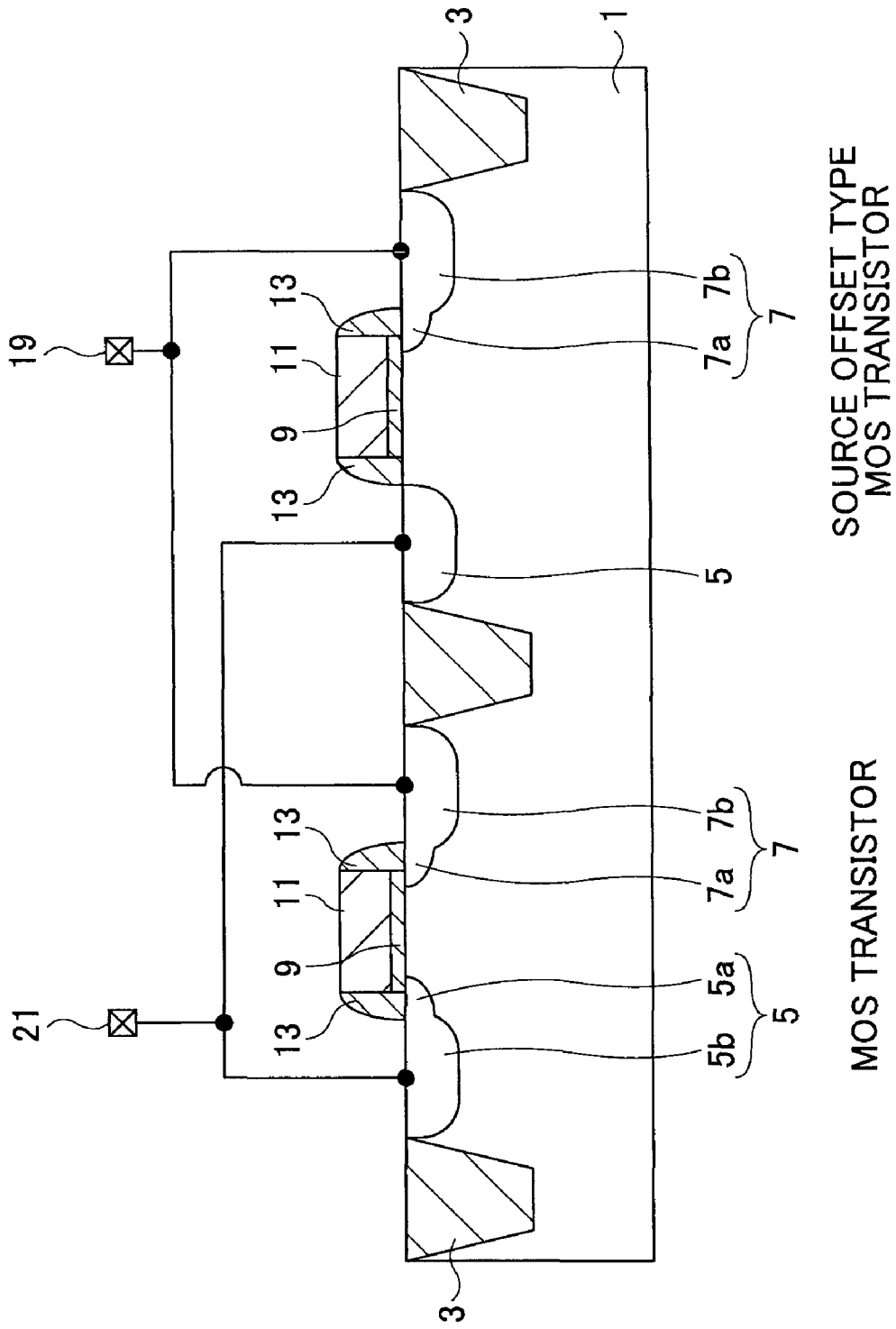
FIG. 5 is a cut-away side view of a source offset type MOS transistor and a MOS transistor according to a second embodiment of the present invention.

FIG. 5 is a cut-away side view of a source offset type MOS transistor and a MOS transistor according to a second embodiment of the present invention.

In the second embodiment of the present invention, when an element is similar to or the same as that in the first embodiment of the present invention, the same reference number as that in the first embodiment of the present invention is used for the element, and the same description as that in the first embodiment of the present invention is omitted.

As shown in FIG. 5, in the second embodiment of the present invention, the source offset type MOS transistor and the MOS transistor are combined.

In the MOS transistor according to the second embodiment of the present invention, similar to the drain 7 in the source offset type MOS transistor according to the first embodiment of the present invention, a source 5 has an LDD structure in which a low concentration diffusion layer 5a and a high concentration diffusion layer 5b are included. That is, in the MOS transistor, one end of the gate electrode 11 overlaps one end of the drain 7 and the other end of the gate electrode 11 overlaps one end of the source 5 when viewed from above the gate electrode 11.

By a process similar to the process shown in FIG. 2(b), in the MOS transistor, a resist pattern 15 is formed which pattern also has an opening section at a region where a source is to be formed. Then, a low concentration diffusion layer 5a is formed by implanting, for example, phosphorus ions with the use of the resist pattern 15 and the gate electrode 11 as masks. That is, the low concentration diffusion layer 5a can be formed by the process similar to the process shown in FIG. 2(b).

As described in FIG. 3A, in the MOS transistor in which the distance between the source and the gate electrode is 0.0 μm when viewed from above the gate electrode, the drain current is lowered when the temperature rises.

In the source offset type MOS transistor according to the second embodiment of the present invention, the distance between the source 5 and the gate electrode 11 is determined to be 0.3 μm when viewed from above the gate electrode 11, and the drain current rises when the temperature rises, inverse to the MOS transistor.

As shown in FIG. 5, the source offset type MOS transistor and the MOS transistor are connected in parallel between an input terminal 19 and an output terminal 21. That is, the drain 7 of the source offset type MOS transistor and the drain 7 of the MOS transistor are connected to the input terminal 19 which is a common terminal for the drains 7, and the source 5 of the source offset type MOS transistor and the source 5 of the MOS transistor are connected to the output terminal 21 which is a common terminal for the sources 5.

Figure 6:
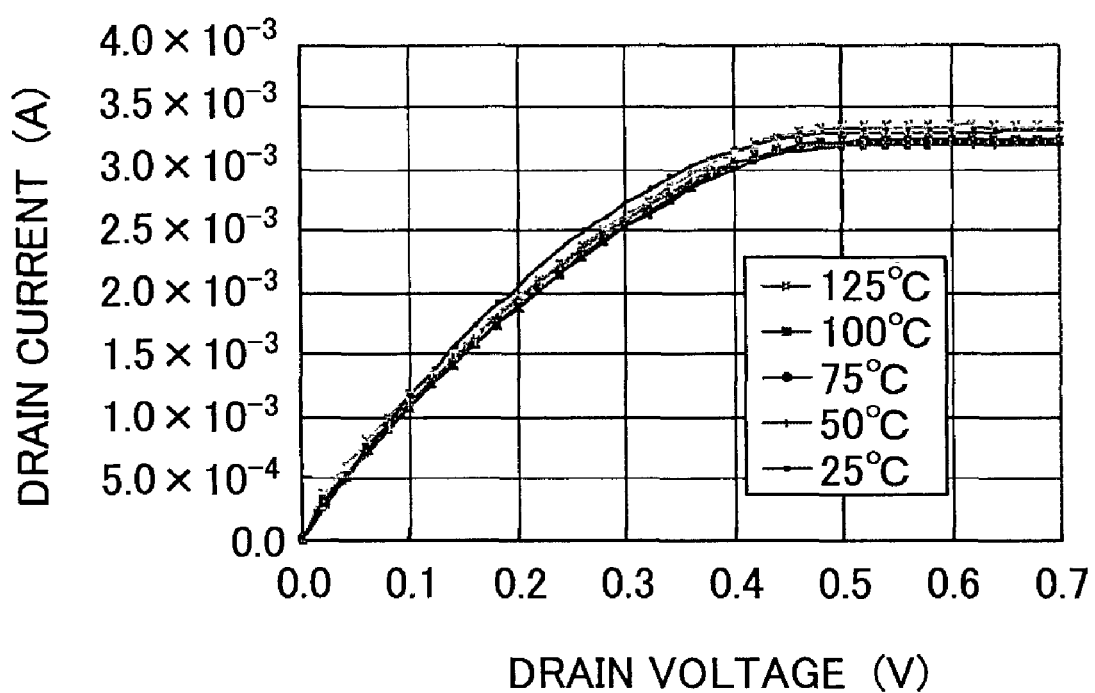
FIG. 6 is a graph showing measured results of the characteristics of the drain voltage and the drain current according to the second embodiment of the present invention.
Figure 7:
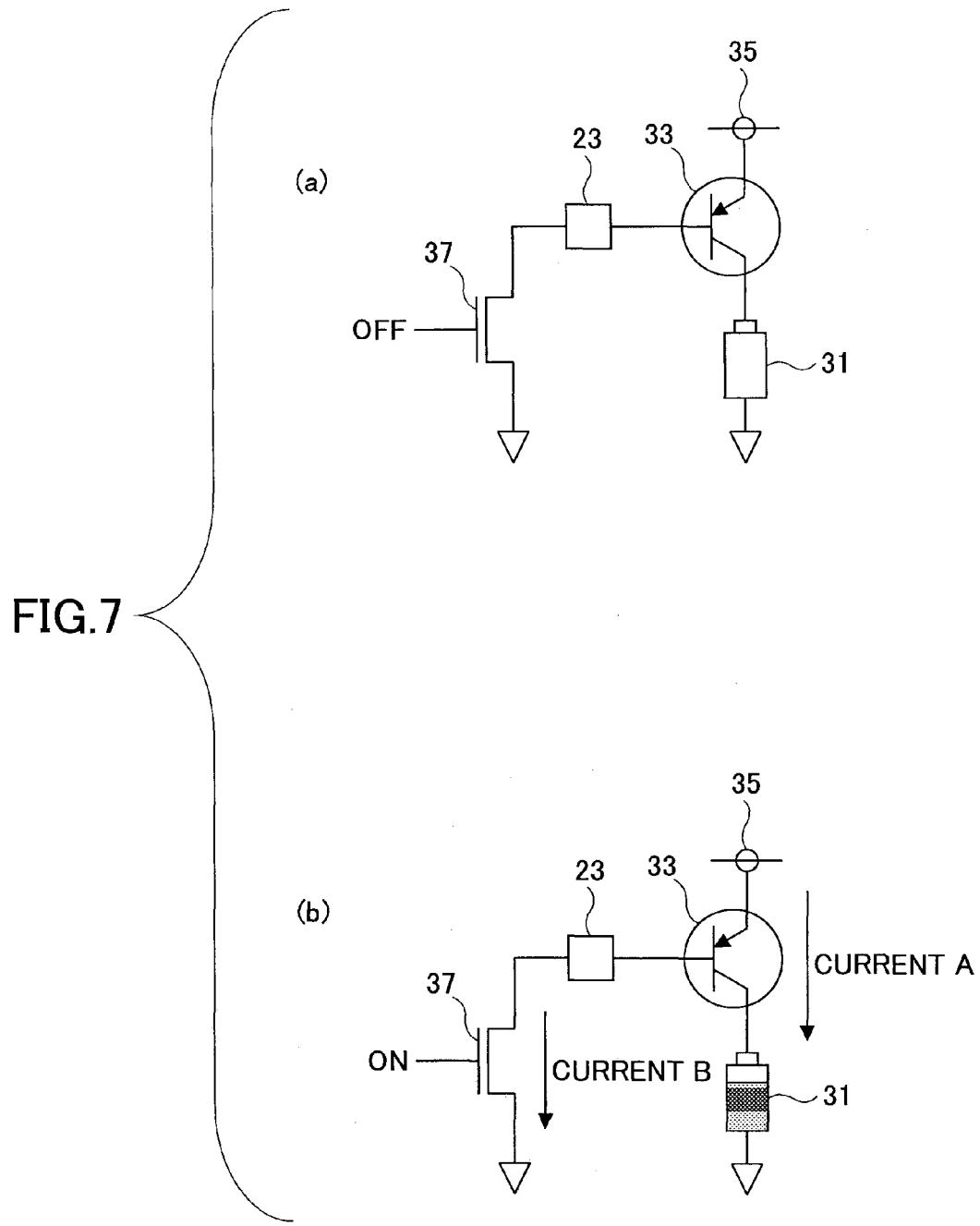
FIG. 7 is a circuit diagram showing a charging device.

FIG. 6 is a graph showing measured results of the characteristics of the drain voltage and the drain current in the combination of the source offset type MOS transistor and the MOS transistor according to the second embodiment of the present invention. In FIG. 6, the vertical axis shows the drain current and the horizontal axis shows the drain voltage.

As shown in FIG. 6, when the source offset type MOS transistor and the MOS transistor are connected in parallel in which the temperature characteristics in the drain voltage and the drain current are inverse to each other, the drain current was changed in a range of approximately 3% at the temperature of 25 to 125° C.

When the distance between the source 5 and the gate electrode 11 in the source offset type MOS transistor, the sizes of the source offset type MOS transistor and the MOS transistor, and the impurity concentration in the source 5 and the drain 7 are adjusted, the temperature characteristics in the drain current and the drain voltage can be constant.

In the embodiments of the present invention, the materials, the shapes, the positions, and the number of the elements is not limited to the above description, and those can be changed.

For example, in the first embodiment of the present invention, the source offset type MOS transistor includes the one gate electrode 11, the one source 5, and the one drain 7; however, the source offset type MOS transistor can include the plural gate electrodes 11, the plural sources 5, and the plural drains 7. In addition, in the second embodiment of the present invention, the source offset type MOS transistor includes the one gate electrode 11, the one source 5, and the one drain 7; however, the source offset type MOS transistor can include the plural gate electrodes 11, the plural sources 5, and the plural drains 7, and further, the MOS transistor includes the one gate electrode 11, the one source 5, and the one drain 7; however, the MOS transistor can include the plural gate electrodes 11, the plural sources 5, and the plural drains 7.

Figure 8:
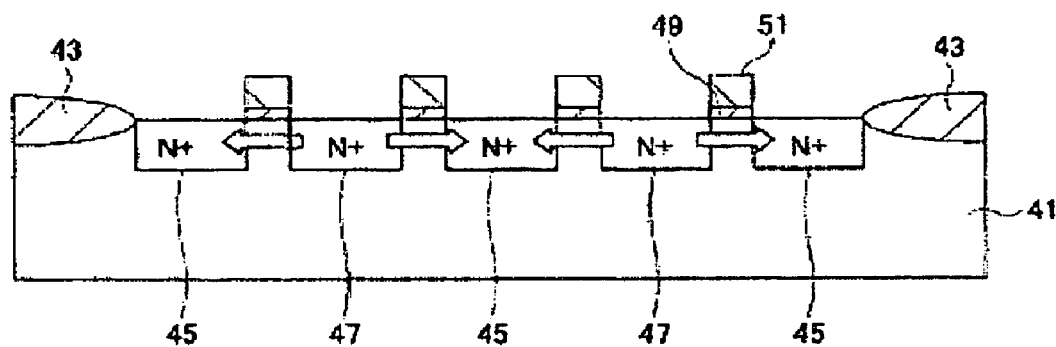
FIG. 8 is a cut-away side view of a conventional driver transistor.

In addition, the source offset type MOS transistor according to the first embodiment of the present invention can be used as the driver transistor shown in FIG. 8. In addition, the combination of the source offset type MOS transistor and the MOS transistor according to the second embodiment can be used as the driver transistor shown in FIG. 8.

In addition, the source offset type MOS transistor according to the first embodiment of the present invention, and the source offset type MOS transistor and the MOS transistor according to the second embodiment of the present invention are N channel types; however, those can be formed of P channel types.

In addition, the drain 7 in the first embodiment of the present invention, the source 5 and the drain 7 in the second embodiment of the present invention have the LDD structure. However, the source 5 and the drain 7 can be formed of a single diffusion layer. In addition, the source offset type MOS transistor and the MOS transistor can be formed without having the side wall 13.

In addition, according to the embodiments of the present invention, in the source offset type MOS transistor, one end of the drain 7 overlaps one end of the gate electrode 11 when viewed from above the gate electrode 11; and in the MOS transistor, one end of the gate electrode 11 overlaps the drain 7 and the other end of the gate electrode 11 overlaps one end of the source 5 when viewed from above the gate electrode 11. However, in the source offset type MOS transistor, the drain 7 can abut on the gate electrode 11 when viewed from above the gate electrode 11, and in the MOS transistor, one or both of the source 5 and the drain 7 can abut on the gate electrode 11 when viewed from above the gate electrode 11.

Further, the present invention is not limited to the specifically disclosed embodiments, and variations and modifications may be made without departing from the scope of the present invention.

The present invention is based on Japanese Priority Patent Application No. 2007-294828, filed on Nov. 13, 2007, with the Japanese Patent Office, the entire contents of which are hereby incorporated herein by reference.

What is claimed is:

1. A semiconductor device, comprising:
a source offset type MOS transistor in which a source and a drain are formed on a semiconductor substrate by having a predetermined distance between the source and the drain, and a gate electrode is formed on the semiconductor substrate between the source and the drain via a gate insulation film; wherein
one end of the drain overlaps or abuts on one end of the gate electrode when viewed from above the gate electrode,
the source is formed by having a distance from the gate electrode when viewed from above the gate electrode, and
the distance between the source and the gate electrode when viewed from above the gate electrode is a value where a current saturation region of a drain current-voltage characteristic remains unchanged by changing temperatures.

2. The semiconductor device as claimed in claim 1, wherein:
the source offset type MOS transistor is a driver transistor.

3. The semiconductor device as claimed in claim 1, further comprising:
a MOS transistor in which another source and another drain are formed on the semiconductor substrate of the source offset type MOS transistor by having a predetermined distance between the other source and the other drain, and another gate electrode is formed on the semiconductor substrate between the other source and the other drain via another gate insulation film; wherein
one end of the other drain overlaps or abuts on one end of the other gate electrode when viewed from above the other gate electrode in the MOS transistor, and one end of the other source overlaps or abuts on the other end of the other gate electrode when viewed from above the other gate electrode in the MOS transistor; and
the source offset type MOS transistor is connected in parallel to the MOS transistor and the source of the source offset type MOS transistor and the other source of the MOS transistor are connected to a common output terminal.

4. The semiconductor device as claimed in claim 3, wherein: the distance between the source and the gate electrode when viewed from above the gate electrode in the source offset type MOS transistor is determined to be a value where a current saturation region of another drain current-voltage characteristic remains unchanged by changing temperatures at the common output terminal.

5. The semiconductor device as claimed in claim 4, wherein:
the combination of the source offset type MOS transistor and the MOS transistor is a driver transistor.

6. The semiconductor device as claimed in claim 1, wherein the drain of the source offset type MOS transistor includes a high concentration diffusion layer and includes a low diffusion layer that is interposed between the high concentration diffusion layer and the gate electrode, and an end of the low diffusion layer overlapping or abutting said one end of the gate electrode.

7. The semiconductor device as claimed in claim 1, wherein the source is separated from the gate electrode by a side wall formed on a side surface of the gate electrode.

* * * * *